US006959317B1

(12) United States Patent
Lamb

(10) Patent No.: US 6,959,317 B1
(45) Date of Patent: Oct. 25, 2005

(54) METHOD AND APPARATUS FOR INCREASING PROCESSING PERFORMANCE OF PIPELINED AVERAGING FILTERS

(75) Inventor: Jonathan Lamb, Ringwood (GB)

(73) Assignee: Semtech Corporation, Newbury Park, CA (US)

( * ) Notice: Subject to any disclaimer, the term of this patent is extended or adjusted under 35 U.S.C. 154(b) by 543 days.

(21) Appl. No.: 10/010,713

(22) Filed: Nov. 9, 2001

Related U.S. Application Data

(60) Provisional application No. 60/287,229, filed on Apr. 27, 2001.

(51) Int. Cl.[7] .............................................. G06F 7/50
(52) U.S. Cl. ...................................... 708/706; 708/709
(58) Field of Search ................................ 708/706, 709

(56) References Cited

U.S. PATENT DOCUMENTS

| 4,128,890 | A | * | 12/1978 | Irwin et al. .................. 708/320 |
| 4,658,355 | A | * | 4/1987 | Hatakeyama et al. .......... 712/4 |
| 4,819,081 | A | | 4/1989 | Volk et al. ................... 328/134 |
| 5,159,292 | A | | 10/1992 | Canfield et al. ............... 331/1 |
| 5,572,453 | A | * | 11/1996 | Miyake et al. ............... 708/521 |
| 5,590,065 | A | * | 12/1996 | Lin ............................ 708/313 |
| 5,883,533 | A | | 3/1999 | Matsuda et al. ............. 327/156 |
| 5,905,388 | A | | 5/1999 | Van Der Valk et al. ...... 327/107 |
| 5,970,110 | A | | 10/1999 | Li ................................ 377/48 |
| 6,121,816 | A | | 9/2000 | Tonks et al. ................. 327/296 |
| 6,198,355 | B1 | | 3/2001 | Lindquist et al. ............. 331/27 |
| 6,304,116 | B1 | | 10/2001 | Yoon et al. .................. 327/158 |
| 6,323,692 | B1 | | 11/2001 | Tsinker ........................ 327/12 |
| 6,429,707 | B1 | | 8/2002 | Lamb et al. ................. 327/159 |
| 6,483,389 | B1 | | 11/2002 | Lamb .......................... 331/25 |
| 2002/0124038 | A1 | * | 9/2002 | Saitoh et al. ................ 708/513 |

* cited by examiner

Primary Examiner—D. H. Malzahn
(74) Attorney, Agent, or Firm—Thelen Reid & Priest, LLP; David B. Ritchie

(57) ABSTRACT

A pipelined processor such as an averaging filter including at least one subtractor section and at least one adder section. Both of the subtractor section and the adder section have a plurality of adder logic units. In comparison to the conventional processor, the processor of the present invention is streamlined by the application of one or more of three techniques. First, there is the interleaving approach where the subtractor section and the adder section are interleaved with one another. Second, there is the one delay feedback approach where the adder section includes a one delay feedback for each of the adder logic units. Third, there is the delay enable signal output approach where the averaging filter includes a delay enable signal output for each of the adder logic units of the adder section.

32 Claims, 5 Drawing Sheets

US 6,959,317 B1

METHOD AND APPARATUS FOR INCREASING PROCESSING PERFORMANCE OF PIPELINED AVERAGING FILTERS

REFERENCE TO THE PROVISIONAL APPLICATION

This application claims the benefit of the U.S. Provisional Patent Application Ser. No. 60/287,229, filed on Apr. 27, 2001.

FIELD OF THE INVENTION

The present invention is generally directed to computer pipelines. More specifically, the present invention is directed to increasing the processing performance of a pipelined averaging filter.

BACKGROUND OF THE INVENTION

A technique of processing pipelines to increase data throughput has long been known in the art. A long task is divided into components and each component is distributed to one processor. A new task can begin even though the former tasks have not been completed. In the pipelined operation, different components of the different tasks are executed at the same time by different processors. Presently, pipelines are in widespread use in nearly all types of data processing electronic equipment, such as sophisticated supercomputers, in which fast and efficient processing of data is essential to the overall operation of the system.

Pipelines have been developed in a wide variety of electronic manufacturing and circuit design configurations. One example of the use of a pipeline is an averaging filter used in digital signal processing. An averaging filter generally consists of at least one subtractor module in series with at least one adder module. Each subtractor and adder module typically has numerous adder logic units and data registers. In order to increase the processing efficiency and speed in each of the subtractor and the adder modules, their respective internal adder logic units and registers are typically placed in pipelined arrangements. While an effective approach for increasing processing efficiency and speed, the typical pipelined configuration is not without shortcomings in other aspects. These shortcoming are even more apparent in high speed averaging filters which operate at high clock rates.

SUMMARY OF THE INVENTION

A pipelined processor such as an averaging filter including at least one subtractor section and at least one adder section is disclosed. Both of the subtractor section and the adder section have a plurality of adder logic units. In comparison to the conventional processor, the processor of the present invention is streamlined by the application of one or more of three techniques. First, there is the interleaving approach where the subtractor section and the adder section are interleaved with one another. Second, there is the one delay feedback approach where the adder section includes a one delay feedback for each of the adder logic units. Third, there is the delay enable signal output approach where the averaging filter includes a delay enable signal output for each of the adder logic units of the adder section.

BRIEF DESCRIPTION OF THE DRAWINGS

The accompanying drawings, which are incorporated into and constitute a part of this specification, illustrate one or more exemplary embodiments of the present invention, and together with the detailed description, serve to explain the principles and exemplary implementations of the invention.

In the drawings.

DETAILED DESCRIPTION OF THE INVENTION

Various exemplary embodiments of the present invention are described herein in the context of methods and apparatus for increasing the processing performance of pipelined averaging filters. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
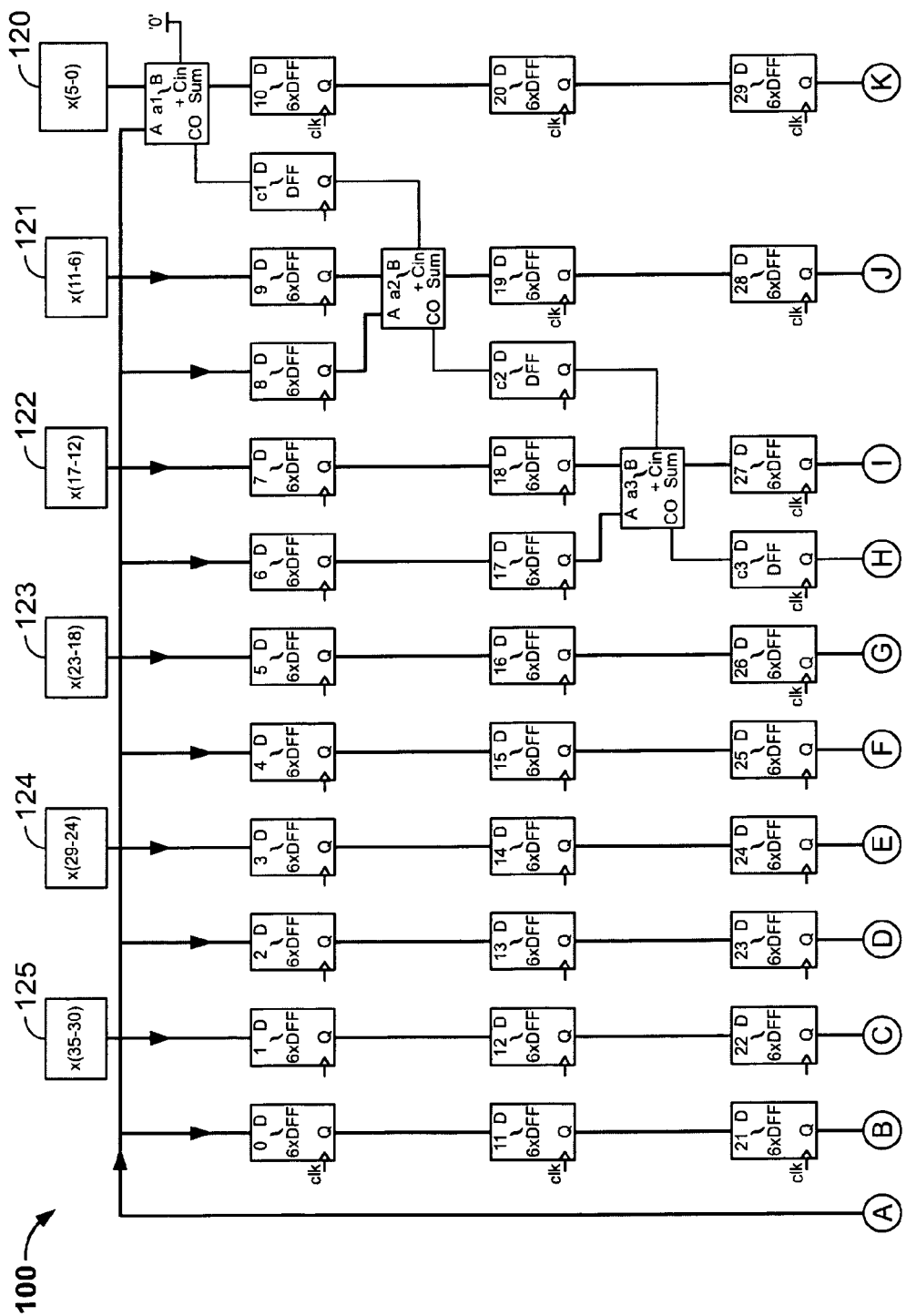
FIG. 1 is a circuit block diagram of an adder module according to the prior art.
Figure 1B:
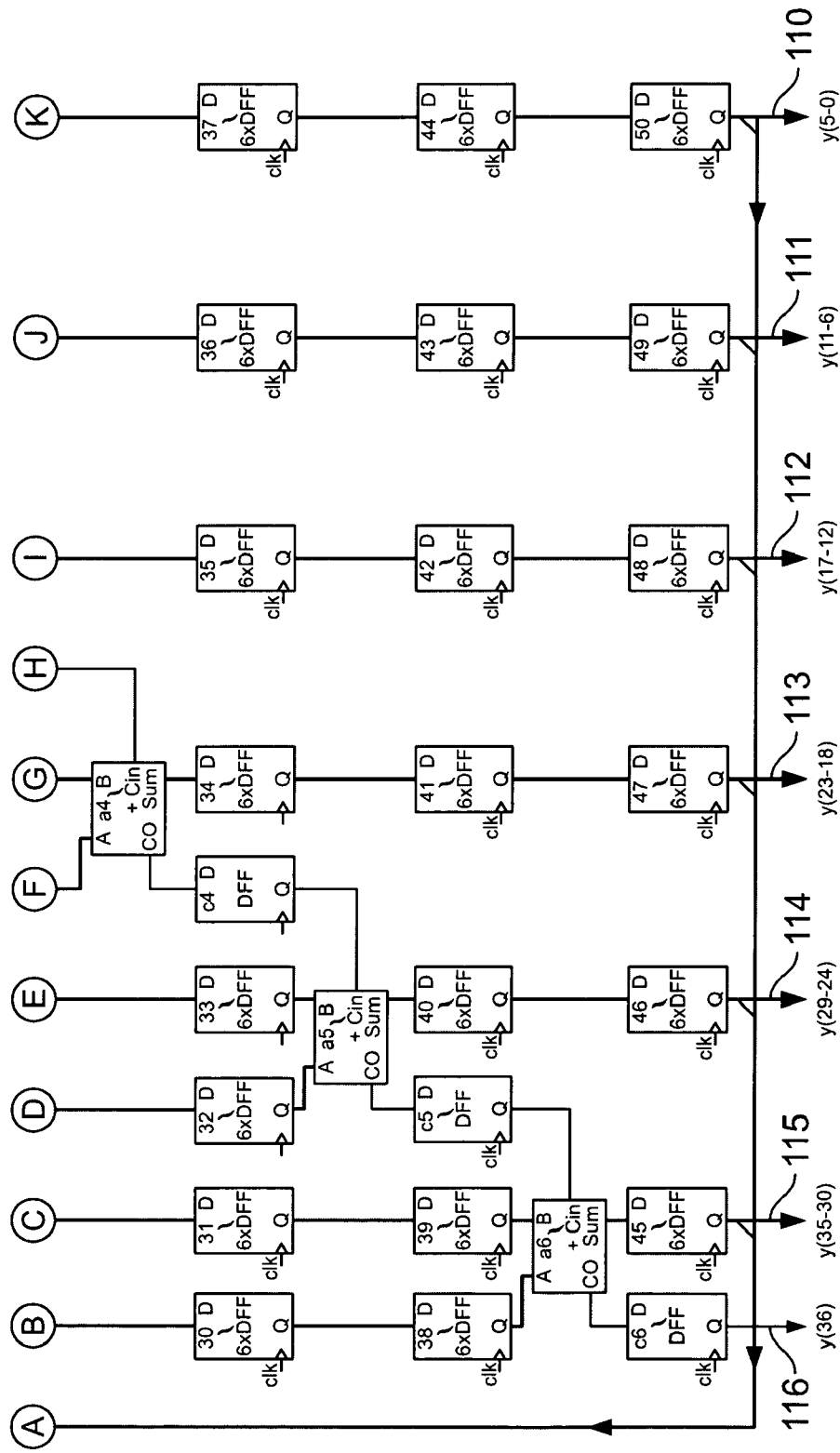

Turning first to FIG. 1, a circuit block diagram of an adder module 100 according to the prior art is shown. As noted above, an averaging filter includes at least one subtractor module and at least one adder module in series. Generally, the adder module has more components than the subtractor module. The single adder module 100 is shown as an example of the magnitude of the component numbers in a typical averaging filter. For clarity, the subtractor module is not shown. Typical subtractor module and averaging filter designs are well known to one of ordinary skill in the art. For a first order averaging filter, there is one subtractor module and one adder module and they operate together to produce a numerical average of an inputted number sequence according to the following mathematical equation:

$$y(n)=ax(n)+(1-a)y(n-1) \qquad \text{Eq. 1}$$

where y(n) represents the filter output at time n, ax(n) represents the adder component, (1−a) represents the subtractor component, and y(n−1) representing the delay element at time n−1.

For discussion purposes, the adder module 100 shown operates on thirty six bit numbers and may be used in a conventional thirty six bit averaging filter. The pipelining takes the form of splitting each add operation into smaller add blocks which can be completed within the clock period of the digital clock that drives the circuit. The faster the clock is the smaller the add blocks have to be. In this case, assume that the thirty six bit addition is broken into six blocks of six bit additions. Other combinations of blocks are also possible with multiples of two bits being preferred. The addition results are stored in registers or D-type flip flops (DFFs). As shown, the thirty six bit adder module 100 includes adding blocks in the form of six adder logic units a1–a6 and five associated carry delay gates c1–c5. The adder module 100 also includes three hundred delay elements in the form of fifty delayed flip flop gate icons D0–D50 where each of the fifty icons D0–D50 represent six actual DFFs.

In order to complete the addition process, more than one processing cycle is required. The thirty six bit number (bits 0–35) is first parsed into six segments of six bit lengths and entered into the adder module 100 via input gates 120–125. Each six bit segment is added in turn along parallel paths. In the first clock cycle, the adder logic unit a1 receives the first of six bit segments x(5–0), performs the addition operation, and stores the result in DFF 10 with the carry going to carry delay gate c1. Simultaneously, the bits in each of the other five segments of the thirty six bit number are loaded into the DFFs 1, 3, 5, 7, 9, respectively. Subsequent additions of the next bit segments are completed in the subsequent clock cycles in a similar manner via adder logic units a2–a5. The addition result for each six bit segment is stored or accumulated until all of the six bit segments have been processed. For the first six bit segment, the stored result is passed down a chain of DFFs 10, 20, 29, 37, 44, 50 with each subsequent clock cycle. Finally, once all of the necessary operations are carried out, the results are outputted in the form of outputs 110–116.

The subtractor module that is necessary to the operation of an averaging filter is also made of adders and therefore also uses adding blocks as shown in FIG. 1. To make a subtractor module, all the bits of the number are first inverted and then added to an integer value of one. This is a commonly used process known as a twos complement. By contrast to the adder module, the corresponding subtractor module needs only half as many bits. Thus, in the example shown, only an eighteen bit subtractor module would be coupled to the thirty six bit adder module to form the averaging filter. Nevertheless, the subtractor module also contains a significant number of circuit elements depending on the application. In total, 387 DFFs would be needed to form the thirty six bit averaging filter using conventional designs.

Figure 2A:
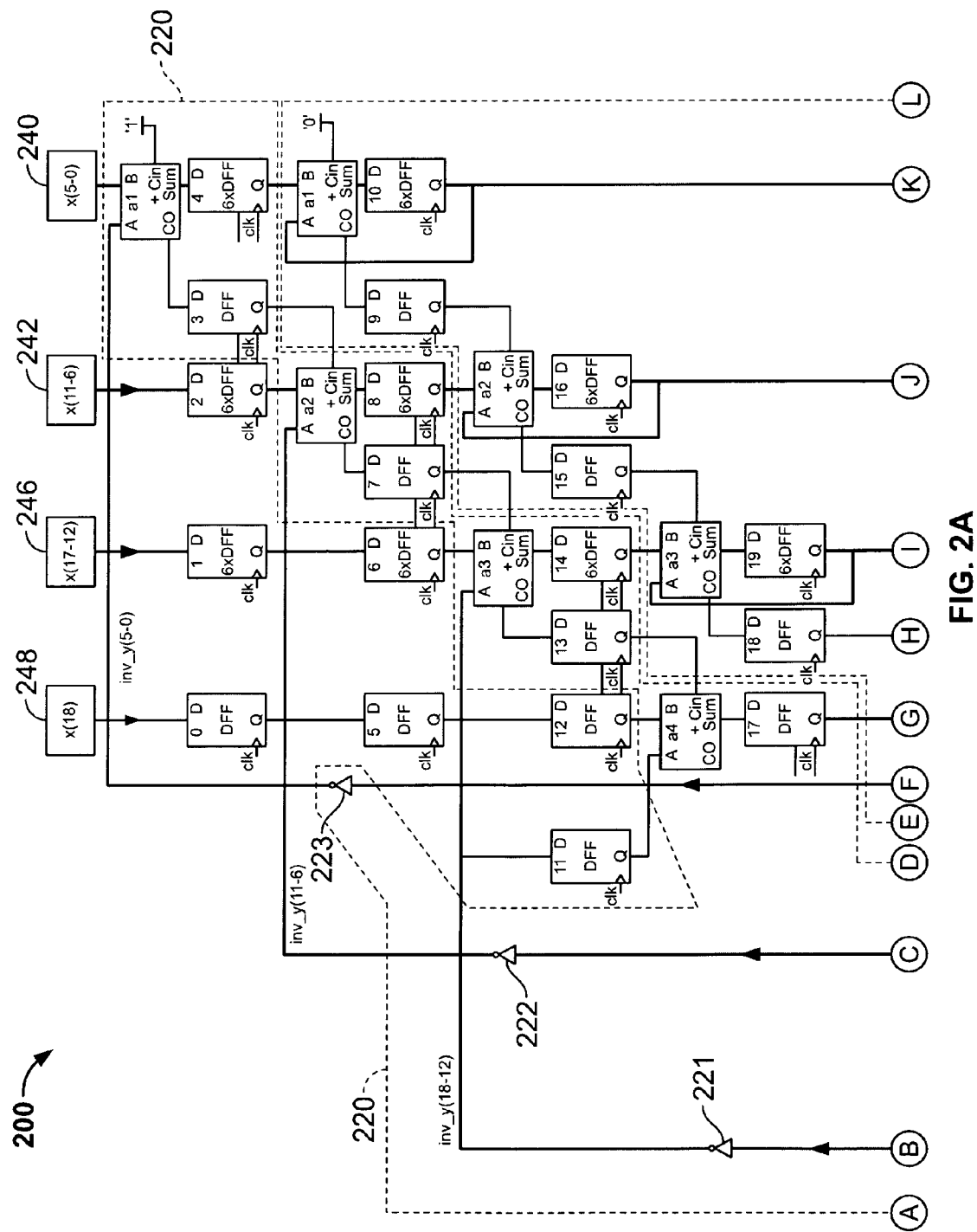
FIG. 2 is a circuit block diagram of an exemplary embodiment of a first order averaging filter in accordance with the present invention.
Figure 2B:
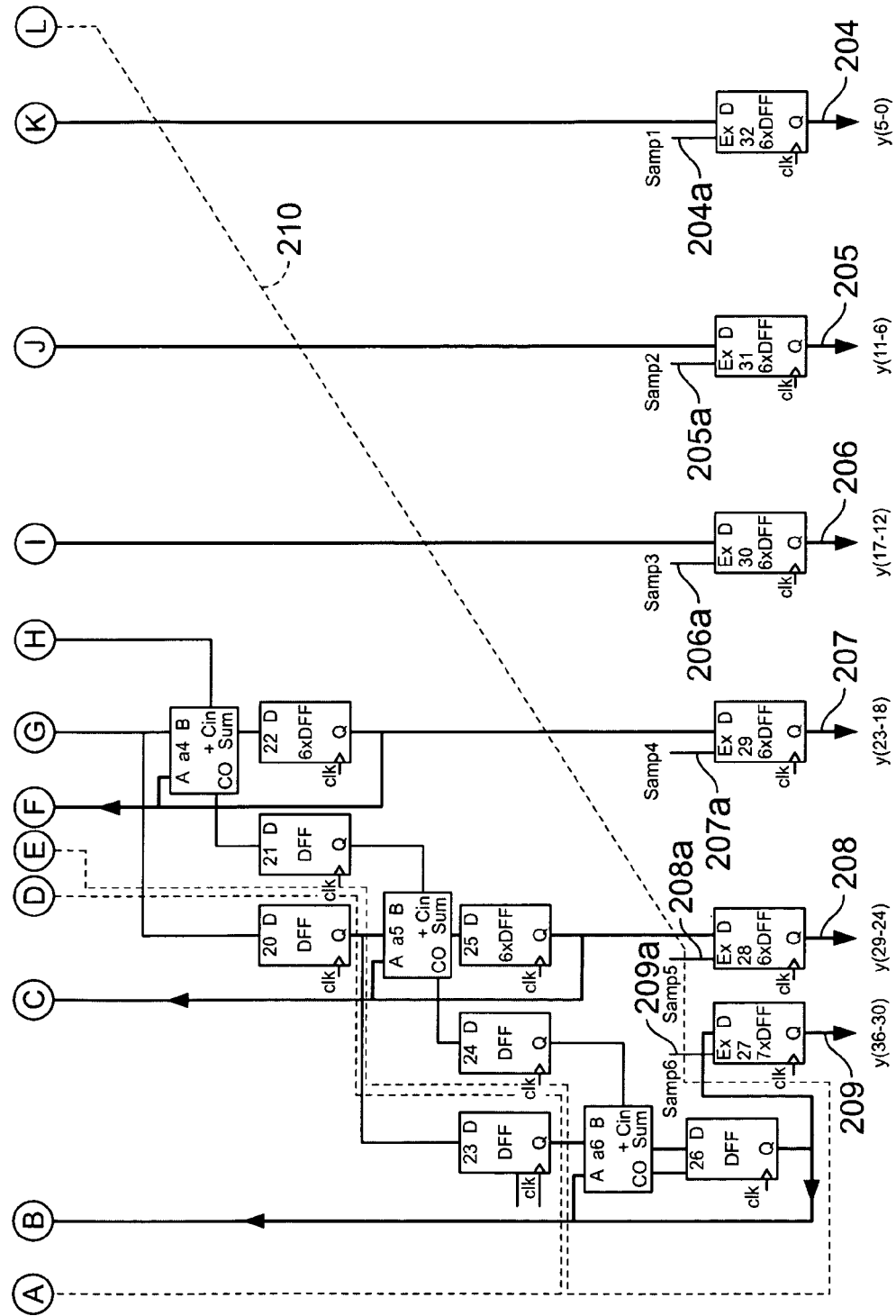

Turning now to FIG. 2, a circuit block diagram of an exemplary embodiment of a first order averaging filter 200 in accordance with the present invention is shown. The averaging filter 200 includes a subtractor section 220 interleaved with an adder section 210. As above, for discussion purposes, the averaging filter 200 operates on a thirty six bit number. The subtractor section 220 includes four adder logic units s1–s4. The adder section 210 includes six adder logic units a1–a6.

As shown, the averaging filter 200 employs an interleaving approach. According to this approach, the adder logic units s1–s4 in the subtractor section 220 are interleaved by being coupled to a corresponding adder logic unit a1–a4 in the adder section 210. In this way an output of each of the adder logic units s1–s4 in the subtractor section 220 is inputted directly into an input of a corresponding adder logic unit in the adder section 210. One advantage of the interleaving approach is that each segment of the inputted data string which is processed by an adder logic unit in the subtractor section 220 is then processed by an adder logic unit in the adder section 210 without first having to await the processing completion of the entire string in the subtractor section 220. For example, segment x(5–0) is processed by the adder logic unit s1 in the subtractor section 220 and then by the adder logic unit a1 in the adder section 210 before segment x(18) is processed by the adder unit s4 in the subtractor section 220. By comparison to the sequential two module approach described with respect to FIG. 1, the foregoing interleaving approach reduces the number of DFFs needed for processing the output of the subtractor section 220 and the input of the adder section 210.

Also shown in FIG. 2, the adder section 210 employs a one delay feedback approach. According to this approach, the output of the adder logic unit is fed back to the input of the adder logic unit after being delayed for one clock cycle. For example, the x(5–0) output of the adder logic unit a1 is fed back to its input after being delayed for one clock cycle by the DFF 10. By contrast, the x(5–0) output of the adder logic unit a1 of FIG. 1 is not fed back until after the DFF 50 of FIG. 1. That represents five more clock cycles. Similar to the interleaving approach above, the one delay feedback approach reduces the number of DFFs. In this case, the DFFs are in the input stream. For example, the x(35–30) delayed input of logic unit a6 of FIG. 1 includes five DFFs 0, 11, 21, 30, 38 which are not correspondingly present in FIG. 2. Although each bit segment of the adder section 210 differs, all benefit from the one delay feedback approach in one way or another.

Also shown in FIG. 2, the averaging filter 200 employs a delay enable signal output approach. This approach would also work with either a subtractor module or an adder module in isolation. According to the delay enable signal output approach, a number of sample-and-hold subsystems En27–En32 are each placed in electrical communication with a corresponding pipelined adder logic unit a1–a5. Each sample-and-hold subsystem samples an output of the corresponding adder logic unit at predetermined time intervals set by a delay enable signal and outputs the sample in the form of a corresponding output after the predetermined delay time. For example, sample-and-hold subsystem En32 samples the output of adder logic unit a1 at predetermined time intervals set by a delay enable signal Samp1 on input 204a and outputs the sample signal on output 204. By comparison to the adder module 200 of FIG. 1, the delay enable signal approach reduces the number of DFFs needed for processing the output of the adder section 210. For example, the adder logic unit a1 of FIG. 2 has effectively two DFFs 10, En32. By contrast, the adder logic unit a1 of FIG. 1 has six DFFs 10, 20, 29, 37, 44, 50. Although each bit segment of the adder section 210 differs, most benefit from the delay enable signal output approach.

Figure 3:
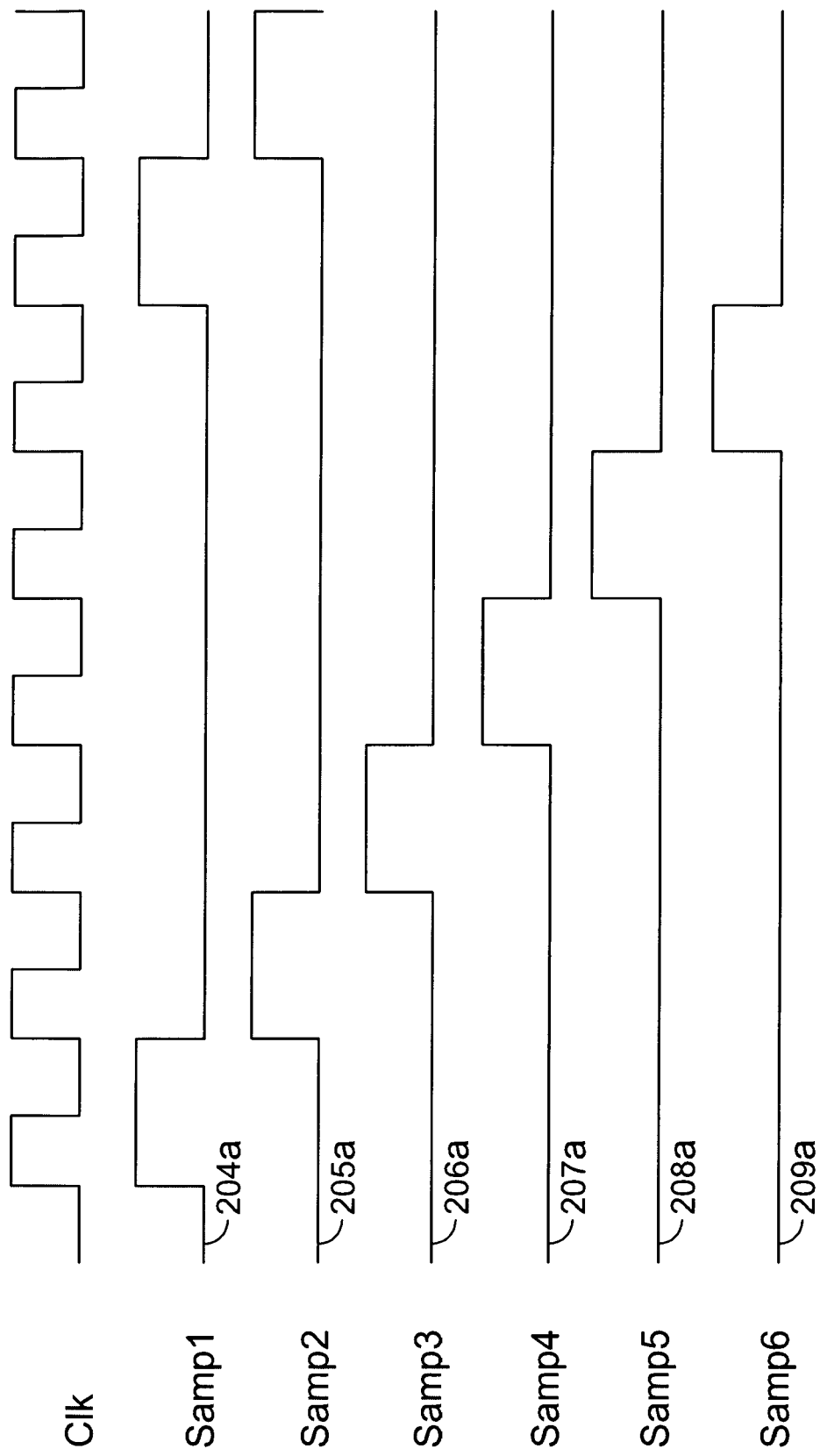
FIG. 3 is a timing diagram illustrating six delay enable signals in accordance with the present invention.

Turning now to FIG. 3, a timing diagram illustrating six delay enable signals in accordance with the present invention is shown. Also shown is the clock (Clk) signal for reference purposes. The six delay enable signals Samp1–Samp6 are input to the six sample-and-hold subsystems En27–En32 of FIG. 2 on their corresponding inputs 204a–209a of FIG. 2. As shown, this sampling is performed by the sequentially delayed sampling signals at predetermined time intervals. The predetermined time intervals and the number of sampling signals varies according to the total number of adder logic units used. In the six adder logic units of the exemplary embodiment shown in FIG. 2, the predetermined time intervals in each of the sampling signals Samp2 to Samp6 are cued from the rising edge of Samp1, which is also used in the subsequent processing stages to enable a read of the final filter output values. Signals having inverse logic could also be used. Accordingly, by producing a series of sampling pulses for the sample-and-hold subsystems, an equivalent functionality of the many DFFs used in the prior art is achieved.

Applied together, the three approaches presented with respect to FIG. 2 achieve a substantial savings. Recall that the conventional first order averaging filter uses 387 DFFs. By contrast, the first order averaging filter in FIG. 2 only uses 123 DFFs. This is less than one third of the DFF count used in the conventional approach. The foregoing approaches therefore advantageously reduce delay-gate count, thereby reducing the associated processing time delay and manufacturing complication and cost for the implementing additional delay flip flops.

It should be noted that the three approaches presented with respect to FIG. 2 were discussed separately for clarity of description and that they can be incorporated in whole or in part into a single embodiment of the present invention utilizing all or some of these approaches. It should further be noted that the present invention is not limited to averaging filters, either of first order or in general, but can readily be used in conjunction with virtually any devices that utilizes pipelining.

Other embodiments, features, and advantages of the present invention will be apparent to those skilled in the art from a consideration of the foregoing specification as well as through practice of the invention and alternative embodiments and methods disclosed herein. Therefore, it should be emphasized that the specification and examples are exemplary only, and that the true scope and spirit of the invention is limited only by the following claims.

What is claimed is:

1. A pipelined averaging filter comprising:
   at least one subtractor section having a plurality of adder logic units; and
   at least one adder section having a plurality of adder logic units, each adder logic unit of the at least one adder section being associated with a corresponding adder logic unit of the at least one subtractor section,
   wherein the at least one subtractor section and the at least one adder section are interleaved with one another such that each adder logic unit of the at least one adder section is coupled to the corresponding adder logic unit of the at least one subtractor section to thereby receive therefrom as a direct input the output of said corresponding adder logic unit of the at least one subtractor section.

2. The pipelined averaging filter as defined in claim 1, wherein the at least one adder section includes a one delay feedback for each of the plurality of adder logic units.

3. The pipelined averaging filter as defined in claim 2, wherein the averaging filter includes a delay enable signal output for each of the plurality of adder logic units of the at least one adder section.

4. The pipelined averaging filter as defined in claim 3, further comprising a delay enable signal for each delay enable signal output.

5. The pipelined averaging filter as defined in claim 1, wherein the averaging filter includes a delay enable signal output for each of the plurality of adder logic units of the at least one adder section.

6. The pipelined averaging filter as defined in claim 5, further comprising a delay enable signal for each delay enable signal output.

7. A pipelined averaging filter comprising:
   at least one subtractor section having a plurality of adder logic units; and
   at least one adder section having a plurality of adder logic units,
   wherein the at least one adder section includes a one delay feedback for each of the plurality of adder logic units and comprises a plurality of bit segments that are different from one another.

8. The pipelined averaging filter as defined in claim 7, wherein the averaging filter includes a delay enable signal output for each of the plurality of adder logic units of the at least one adder section.

9. The pipelined averaging filter as defined in claim 8, further comprising a delay enable signal for each delay enable signal output.

10. A pipelined averaging filter comprising:
    at least one subtractor section having a plurality of adder logic units; and
    at least one adder section having a plurality of adder logic units,
    wherein the averaging filter includes a delay enable signal output for each of the plurality of adder logic units of the at least one adder section.

11. The pipelined averaging filter as defined in claim 10, further comprising a delay enable signal for each delay enable signal output.

12. A pipelined processor comprising:
    a plurality of adder logic units grouped into bit segments that are different from one another; and
    a one delay feedback for each of the plurality of adder logic units.

13. A pipelined processor comprising:
    a plurality of adder logic units grouped into bit segments that are different from one another; and
    a delay enable signal output for each of the plurality of adder logic units.

14. The pipelined processor as defined in claim 13, further comprising a delay enable signal for each delay enable signal output.

15. The pipelined processor as defined in claim 13, further comprising a one delay feedback for each of the plurality of adder logic units.

16. The pipelined processor as defined in claim 15, further comprising a delay enable signal for each delay enable signal output.

17. A pipelined processor comprising:
    at least a first processor section having a plurality of adder logic units; and
    at least a second processor section having a plurality of adder logic units, each adder logic unit of the at least first processor section being associated with a corresponding adder logic unit of the at least second processor section,
    wherein the at least a first processor section and the at least a second processor section are interleaved with one another such that each adder logic unit of the at least first processor section is coupled to the corresponding adder logic unit of the at least second processor section to thereby receive therefrom as a direct input the output of said corresponding adder logic unit of the at least second processor section.

18. The pipelined processor as defined in claim 17, wherein the at least a second processor section includes a one delay feedback for each of the plurality of adder logic units.

19. The pipelined processor as defined in claim 18, wherein the processor includes a delay enable signal output for each of the plurality of adder logic units of the at least a second processor section.

20. The pipelined processor as defined in claim 19, further comprising a delay enable signal for each delay enable signal output.

21. The pipelined processor as defined in claim 17, wherein the processor includes a delay enable signal output for each of the plurality of adder logic units of the at least a second processor section.

22. The pipelined processor as defined in claim 21, further comprising a delay enable signal for each delay enable signal output.

23. A method of pipelined processing an n-bit word, the method comprising:
   dividing the n-bit word into a plurality of bit segments;
   generating a delay enable signal for each of the plurality of bit segments;
   processing the plurality of bit segments; and
   applying the delay enable signal to each of the processed plurality of bit segments to assemble the output of the pipelined processing.

24. The method as defined in claim 23, wherein the plurality of bit segments are of equal length.

25. The method as defined in claim 23, wherein processing comprises applying a one delay feedback to each of the plurality of bit segments.

26. The method as defined in claim 25, wherein processing comprises a first processor section and a second processor section, wherein the first processor section and the second processor section are interleaved with one another.

27. The method as defined in claim 23, wherein processing comprises a first processor section and a second processor section, wherein the first processor section and the second processor section are interleaved with one another.

28. A pipelined processor for an n-bit word, the processor comprising:
   means for dividing the n-bit word into a plurality of bit segments;
   means for generating a delay enable signal for each of the plurality of bit segments;
   means for processing the plurality of bit segments; and
   means for applying the delay enable signal to each of the processed plurality of bit segments to assemble the output of the pipelined processor.

29. The pipelined processor as defined in claim 28, wherein the plurality of bit segments are of equal length.

30. The pipelined processor as defined in claim 28, wherein means for processing comprises means for applying a one delay feedback to each of the plurality of bit segments.

31. The pipelined processor as defined in claim 30, wherein means for processing comprises a first processor section and a second processor section, wherein the first processor section and the second processor section are interleaved with one another.

32. The pipelined processor as defined in claim 28, wherein means for processing comprises a first processor section and a second processor section, wherein the first processor section and the second processor section are interleaved with one another.

* * * * *